(12) United States Patent
Andreev et al.

(10) Patent No.: US 7,168,052 B2
(45) Date of Patent: Jan. 23, 2007

(54) YIELD DRIVEN MEMORY PLACEMENT SYSTEM

(75) Inventors: Alexander E. Andreev, San Jose, CA (US); Andrey A. Nikitin, Moscow (RU); Ranko Scepanovic, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 232 days.

(21) Appl. No.: 10/875,128

(22) Filed: Jun. 23, 2004

(65) Prior Publication Data

US 2006/0010092 A1   Jan. 12, 2006

(51) Int. Cl.
G06F 17/50 (2006.01)
G06F 9/45 (2006.01)
H03K 17/693 (2006.01)
H03K 19/00 (2006.01)

(52) U.S. Cl. .................. 716/2; 716/9; 716/10; 716/16; 716/17

(58) Field of Classification Search .................. 716/2, 716/5, 7, 9, 10, 16–17
See application file for complete search history.

(56) References Cited

U.S. PATENT DOCUMENTS

| | | | | |
|---|---|---|---|---|
| 4,400,794 A | * | 8/1983 | Koos | 711/202 |
| 6,601,205 B1 | * | 7/2003 | Lehmann et al. | 714/741 |
| 6,611,952 B1 | * | 8/2003 | Prakash et al. | 716/18 |
| 6,871,328 B1 | * | 3/2005 | Fung et al. | 716/1 |
| 2004/0193829 A1 | * | 9/2004 | Woo et al. | 711/170 |
| 2005/0240746 A1 | * | 10/2005 | Nikitin et al. | 711/170 |

OTHER PUBLICATIONS

U.S. Appl. No. 10/688,460, filed Oct. 17, 2003, Process and Apparatus for Fast Assignment of Objects to a Rectangle (22 pages).
U.S. Appl. No. 10/694,208, filed Oct. 27, 2003, Process and Apparatus for Placement of Cells in an IC During Floorplan Creation (26 pages).
U.S. Appl. No. 10/830,739, Process and Apparatus for Memory Mapping (26 pages).

* cited by examiner

Primary Examiner—Paul Dinh
Assistant Examiner—Suresh Memula
(74) Attorney, Agent, or Firm—Westman Champlin & Kelly

(57) ABSTRACT

A user-defined memory design is mapped to memories of a base platform for an IC that contains a plurality of memory sets, each containing a plurality of memories of a predetermined type. An optimal memory set is selected from the plurality of memory sets for the design by selecting a preference rate for each memory set from the plurality of sets based on the design and its connections to portions of the IC, and selectively assigning the design to one of the memory sets based on the preference rate. The design is optimally mapped to a plurality of memories of the selected memory set by defining an index of the position of each customer memory in the selected memory set. The customer memories in the selected memory set are arranged in an order, and successive numbers of memories of the selected memory set are assigned to each customer memory in order.

16 Claims, 5 Drawing Sheets

CREATE MEMORY MAPPING

YIELD DRIVEN MEMORY PLACEMENT SYSTEM

CROSS-REFERENCE TO RELATED APPLICATION

This application is related to U.S. patent application Ser. No. 10/688,460 filed Oct. 17, 2003, for "Process and Apparatus for Fast Assignment of Objects to a Rectangle" by Alexander E. Andreev, Andrey A. Nikitin and Ranko Scepanovic, and to U.S. patent application Ser. No. 10/694,208 filed Oct. 27, 2003, for "Process and Apparatus for Placement of Cells in an IC During Floorplan Creation" by Alexander E. Andreev, Andrey A. Nikitin and Igor A. Vikhliantsev, each of which is assigned to the same assignee as the present application and the contents of each of which are hereby incorporated by reference in their entirety.

FIELD OF THE INVENTION

This invention relates to creation of IC floorplans, and particularly to mapping user-defined memory designs into standard or basic memories for implementation in basic IC platforms.

BACKGROUND OF THE INVENTION

Integrated circuits are used in a wide range electronic devices produced by a large number of device manufacturers. In practice, ICs are seldom manufactured (fabricated) by the electronic device manufacturer. Instead ICs are manufactured by an IC foundry to the specifications of the electronic device manufacturer. The design of the IC is usually the result of collaboration between the device manufacturer and the IC foundry.

The design and manufacture of an application-specific IC, or ASIC, is usually a long and tedious process, requiring development of a hardware description language (HDL) description of the circuit, usually in a synthesizable register transfer language (synthesizable RTL), synthesizing the RTL description to a technology library of components, and ultimately fabricating the circuit into an IC chip. During the process, testing and re-designing is necessary to optimize cell placement to meet physical constraints, wire routing and timing constraints. The process is time consuming and costly.

To reduce the time and cost of development of ASICs, IC foundries have developed standard, or base, platforms containing silicon layers of an IC, but without metal interconnection layers. The silicon layers are configured into gates that can be configured into cells using tools supplied by the IC foundry. The chip designer designs additional metal layers for the base platform to thereby configure the chip into a custom ASIC employing the customer's intellectual property. The IC foundry ordinarily supplies tools to the IC designer to enable the designer to quickly and accurately configure the base platform to a custom ASIC compatible with the foundry's fabrication technology. An example of such a configurable base platform is the RapidChip® platform available from LSI Logic Corporation of Milpitas, Calif. The RapidChip platform permits the development of complex, high-density ASICs in minimal time with significantly reduced design and manufacturing risks and costs.

The design effort can be considered as encompassing several stages. After the chip size and the placement of the I/O cells has been selected, the megacells, including memories, are placed. Thereafter, standard cells are placed to complete the chip. The present invention deals with placement of memories, and particularly to mapping user's custom memories to standard or basic memories that are incorporated into the base platform.

Consider a base platform containing basic sets of memories of a predetermined type, such as RRAMs. RRAMs are sets of memories of the same type that are placed compactly and have built-in testing and self-repairing capabilities. Usually, IC designers prefer not use all of the available memories of the RRAM so that unused memories are available for self-repairing processes. Typically, IC designers use about 90% of the available RRAM memories. The base platform might also contain single memories, such as single diffused memories. The design created by the IC designer may contain user-defined memories, herein sometimes called customer memories, that are different from these basic and single memories. Each customer memory may be mapped into memories of only one RRAM, or it may be mapped into one single diffused memory.

Typically, the base platform also has some area for placement of logical cells and flip-flops, called rcells. Some of this area may be used for mapping customer memories. Thus, each platform has some predetermined area that may be used by rcell-memories.

The present invention is directed to techniques for mapping customer memories to basic and single memories and rcells so that the customer memories can be implemented on the base platform.

SUMMARY OF THE INVENTION

In accordance with an embodiment of the present invention, a user-defined memory design is mapped to memories of a base platform for an IC that contains a plurality of memory sets. Each memory set contains a plurality of memories of a predetermined type. An optimal memory set is selected from the plurality of memory sets for the design, and the design is optimally mapped to a plurality of memories of the selected memory set.

In some versions, the optimal memory set is selected by selecting a preference rate for each memory set from the plurality of sets based on the design and its connections to portions of the IC. The design is selectively assigned to one of the memory sets based on the preference rate.

Optionally, the design comprises a plurality of customer memories, and the assignment of the design is performed by calculating a price for mapping respective customer memories to respective memory sets, calculating preference rates for each memory set based on the price and respective variants of a preference coefficient, attempting to map customer memories to memory sets based on respective preference rates, and selecting the memory set to which the customer memories may be mapped having the optimal preference rate.

In other versions, the design is optimally mapped to a plurality of memories of the selected memory set by defining an index for each customer memory of the position of the customer memory in the selected memory set. The customer memories in the selected memory set are arranged in an order, and successive numbers of memories of the selected memory set are assigned to each customer memory in order.

In other embodiments, a computer useable medium contains a computer readable program comprising computer readable program code for addressing data to cause a computer to carry out the process of the invention.

DETAILED DESCRIPTION OF THE PREFERRED EMBODIMENTS

For purposes of the present description, single diffused memories are considered as a special form of RRAMs containing only one memory. Therefore, RRAMs and single diffused memories can be considered together.

Each RRAM memory has a plurality of memory pins that couple the memory to other portions of the IC. The average position of the memory pins for a given memory of the RRAM can be considered as the position of the memory, and is herein referred to as the "position of RRAM memory". Since all the RRAM pins are usually placed along one side of the RRAM, the position of the RRAM memory also lies on the same side of RRAM. For this reason, one coordinate (x or y) of the positions of the memories is the same for all memories of the RRAM; the other coordinate is variable. Therefore, the positions of the memories of the RRAM can be enumerated in linear order on the variable coordinate.

The present invention is herein described in the context of the RapidChip platform, but the concepts of the present invention is applicable to other base platforms. The present invention provides a technique to map user-defined memory designs, sometimes herein called "customer memories" into platform memories. Moreover, the invention takes into account the customer design structure and connections of memories with other cells in the design. Thus, the technique not only assigns some RRAMs or single diffused memory to each user design but also finds the place for the given customer memory in the RRAM.

Customer memories are assigned to RRAMs "with no holes", that is, the customer memories will be mapped to RRAM memories that are neighbors to each other. For example, if a RRAM contains 50 memories and some customer memory requires eight RRAM memories for mapping, the customer memory is mapped to eight consecutive RRAM memories; the customer memory is not mapped to RRAM memories with numbers 1, 4, 7, 9 . . . .

If a customer memory requires eight memories of a 50-memory RRAM, there are 43 ways to map the customer memory to the RRAM. The memories of the RRAM used for the customer memory can be numbered K, K+1, . . . , K+7, where K=1, 2, . . . , 43. The present invention finds the best K for the customer memory, and the customer memory is assigned to the eight RRAM memories with neighbor numbers K, K+1, K+2, . . . , K+7 only, where K=1, 2, . . . , 43.

Figure 1:
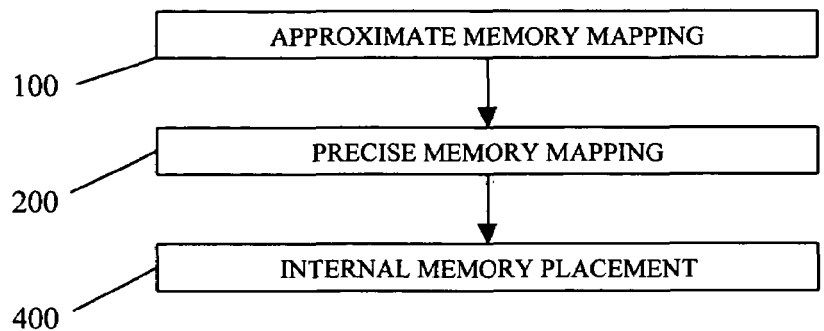
FIG. 1 is a flowchart of a process for memory placement in accordance with a preferred embodiment of the present invention.

As shown in FIG. 1, the memory placement system according to the present invention comprises three stages: an approximate memory mapping stage 100, a precise memory mapping stage 200 and an internal RRAM placement stage 400.

Approximate Memory Mapping Stage 100.

Figure 2:
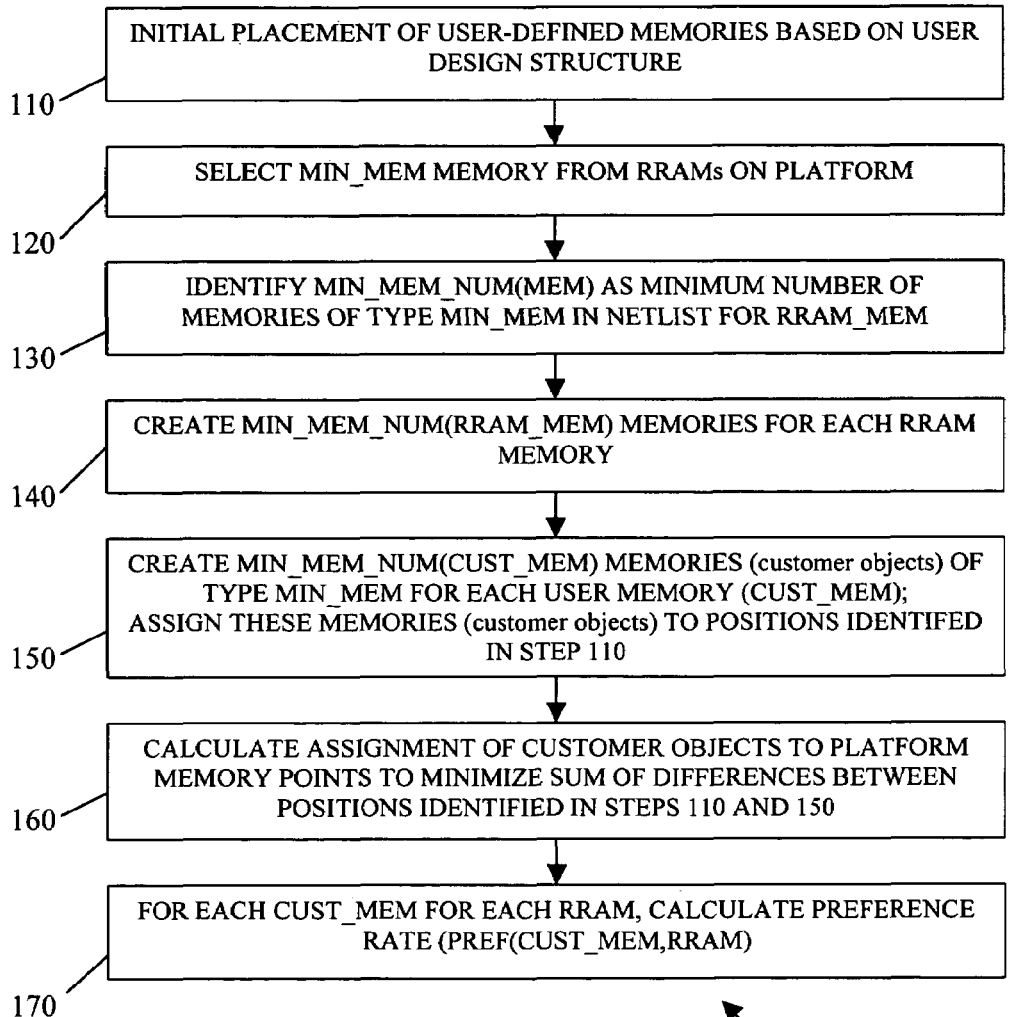
FIGS. 2–6 are detailed flowcharts of portions of the process shown in FIG. 1.

The approximate memory mapping stage, which is shown in greater detail in FIG. 2, finds the preferable RRAM (of several preferable RRAMs) for mapping each customer memory. The preferable RRAMs are found relying on the customer design structure analysis and analysis of customer memories connections with other cells of the customer design. If several preferable RRAMs are found, then a preference rate is calculated for each preferable RRAM to identify the one RRAM that is most preferable.

The approximate memory mapping stage begins at step 110 with the initial placement of customer memories by analysis of the customer design structure. In preferred embodiments, this step is carried out using the techniques described in the aforementioned application Ser. No. 10/694,208 filed Oct. 27, 2003, for "Process and Apparatus for Placement of Cells in an IC During Floorplan Creation" by Alexander E. Andreev, Andrey A. Nikitin and Igor A. Vikhliantsev, which is hereby incorporated by reference in its entirety. More particularly, this step finds the best places (defined by coordinates) for megacells and memories of the customer design by analyzing the global structure of the customer design and the interconnections of the megacells of the customer design with other cells of this design. This step obtains the position on the platform that is the most preferable for placing the given customer memory.

At step 120, a memory MIN_MEM is chosen from all of the RRAM memories on the platform. MIN_MEM memory is the memory having the minimal possible number of bits that can be stored in the memory. The number of bits that can be stored in memory is the product of the capacity and the width of this memory. The capacity of the memory is the number of words that are stored in the memory, and the width of the memory is the number of bits in words stored in the memory.

Each memory MEM (customer memory or memory of the platform RRAM) can be presented as a netlist consisting of some memories of type MIN_MEM and some logical cells and flip-flops. At step 130 MIN_MEM_NUM(MEM) is identified as the minimal possible number of memories of type MIN_MEM in the netlist for RRAM_MEM.

At step 140, all of the memories of each RRAM of the platform are examined. For the currently examined RRAM memory, RRAM_MEM, MIN_MEM_NUM(RRAM_MEM) are created for memories of type MIN_MEM. MIN_MEM_NUM(RRAM_MEM) are herein called "platform memory points". The positions of the created platform memory points are the same as the positions of the corresponding memory RRAM_MEM.

At step 150, MIN_MEM_NUM(CUST_MEM) memories of type MIN_MEM are created for each customer memory CUST_MEM. These MIN_MEM_NUM(CUST_MEM) memories are herein called "customer objects", and are assigned the same preferable positions for placing created customer objects as the preferable position for placing its corresponding customer memory CUST_MEM, obtained at step 110.

The assignment of customer objects to the platform memory points is calculated at step 160 to minimize the sum of distances between the preferable positions of the customer objects and the positions of assigned platform memory points. This assignment can be performed using the known Kuhn's algorithm or the fast assignment algorithm described in the aforementioned U.S. application Ser. No. 10/688,460 filed Oct. 17, 2003, for "Process and Apparatus for Fast Assignment of Objects to a Rectangle" by Alexander E. Andreev, Andrey A. Nikitin and Ranko Scepanovic, the content of which is hereby incorporated by reference in its entirety application Ser. No. 10/688,460 describes a method of fast solving the assignment problem by defining by the preferable positions of the objects to some predetermined points of the platform.

It is not necessary to assign all the customer objects to some platform memory point. Some customer objects might not be assigned to any platform memory point, for example if the total number of customer objects is greater than the total number of platform memory points.

A preference rate PREF(CUST_MEM,RRAM) is calculated at step 170 for each customer memory CUST_MEM for each RRAM. This preference rate PREF(CUST_MEM,RRAM) is a numeric representation of how good it is to map the customer memory CUST_MEM to the RRAM from the point of view of design structure. More particularly, the preference rate is calculated as $$PREF(CUST\_MEM, RRAM) = \left(1 - \frac{D^2(CUST\_MEM, RRAM)}{MAX\_D^2(CUST\_MEM)}\right) + \frac{ASSIGNED(CUST\_MEM, RRAM)}{MIN\_MEM\_NUM(CUST\_MEM)},$$

where D(CUST_MEM,RRAM) is the distance between the preferable position for placing customer memory CUST_MEM and the given RRAM, MAX_D(CUST_MEM) is the maximal distance between the preferable position for placing customer memory CUST_MEM and any RRAM, and ASSIGNED(CUST_MEM,RRAM) is the number of customer objects with parent CUST_MEM that were assigned to some platform memory point with the parent memory belonging to the given RRAM.

Precise Memory Mapping Stage 200.

Figure 3:
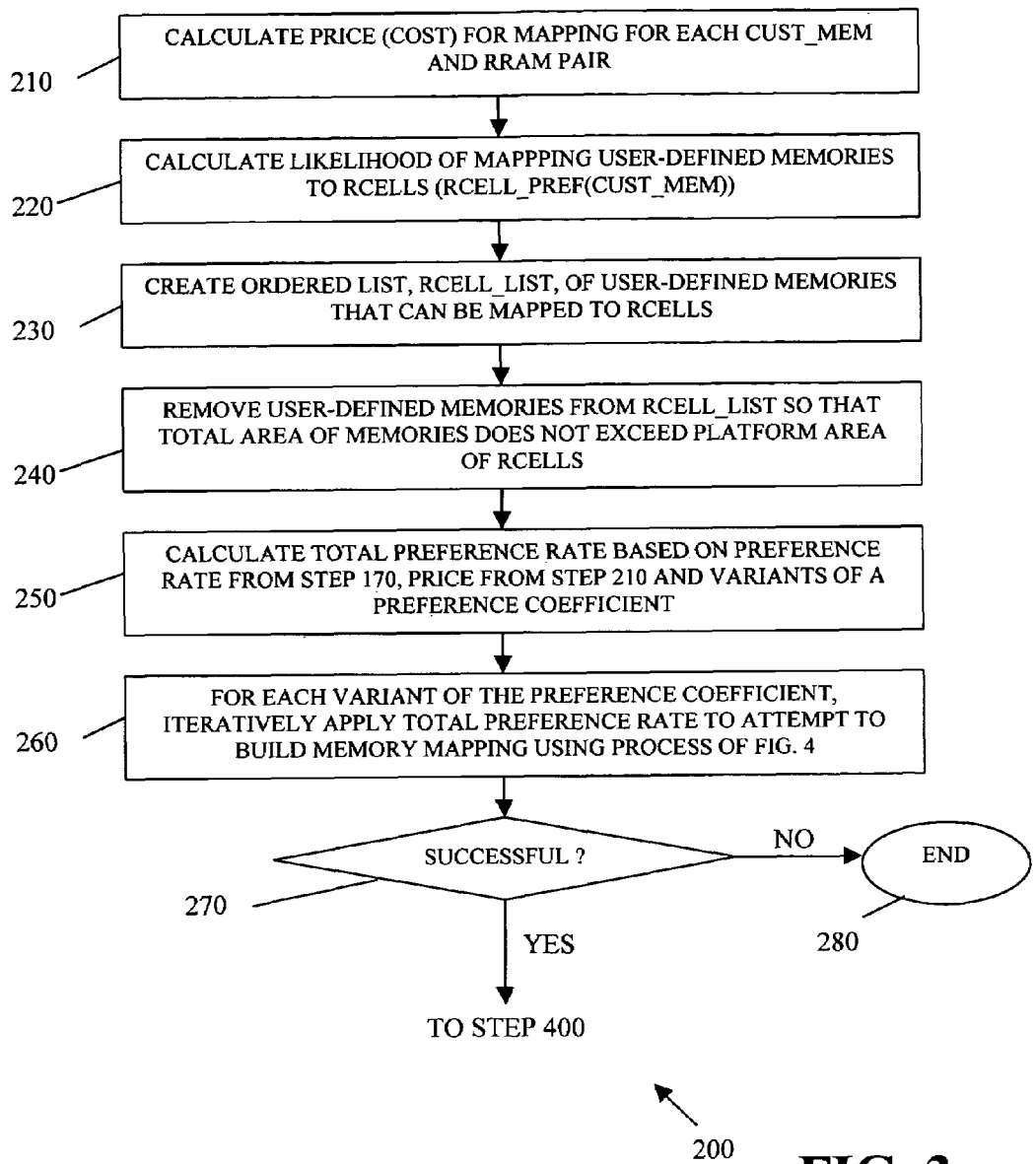

The precise memory mapping stage 200, shown in greater detail in FIG. 3, assigns each customer memory to some RRAM or maps the memory to rcells. The resulting assignment creation is based on the results of the approximate memory mapping and the detailed analysis of certain characteristics of RRAM memories and customer memories.

At step 210, the price (or cost) is calculated for mapping each CUST_MEM and RRAM pair. The magnitude of PRICE(CUST_MEM,RRAM) can be considered as a price that is paid (cost) for mapping the customer memory CUST_MEM to the RRAM. Assign $$PRICE(CUST\_MEM, RRAM) = 1.0 - \frac{CAPACITY(CUST\_MEM) * WIDTH(CUST\_MEM)}{CAPACITY(RRAM) * WIDTH(RRAM) * MAP\_MEM\_NUM(CUST\_MEM, RRAM)},$$

where CAPACITY(CUST_MEM) and WIDTH(CUST_MEM) are the capacity and width of the customer memory CUST_MEM, CAPACITY{RRAM) and WIDTH(RRAM) are capacity and width of memories of the RRAM, and MAP_MEM_NUM(CUST_MEM,RRAM) is the number of memories of the RRAM that are required for mapping customer memory CUST_MEM to the RRAM.

At step 220 the magnitude of the likelihood that the customer memories CUST_MEM can be mapped to rcells is calculated:

$$RCELL\_PREF(CUST\_MEM) = \sum_{RRAM} PRICE(CUST\_MEM, RRAM).$$

At step 230, an ordered list RCELL_LIST is created of all customer memories that can be mapped to rcells. The customer memories of this list are sorted in an order, such as descending order, by the magnitude RCELL_PREF(CUST_MEM). The greater the value RCELL_PREF(CUST_MEM), the higher the customer memory CUST_MEM is to the beginning of RCELL_LIST.

The platform may have some upper bound for the total area of the customer memories mapped to rcells. It may be necessary to remove some customer memories from the bottom of the RCELL_LIST list to meet the upper bound area requirement of the platform. At step 240, if the total area of the customer memories currently included in the RCELL_LIST list exceeds the rcell-memory area restriction, customer memories are removed from the RCELL_LIST list until the total area of the customer memories is within the platform rcell area limitation. RCELL_LIST_SIZE is identified as the number of customer memories remaining on the resulting RCELL_LIST.

The magnitudes PREF(CUST_MEM,RRAM) obtained during the approximate memory mapping stage and the magnitudes PRICE(CUST_MEM,RRAM) obtained at step 210 are the magnitudes that estimate the gain and losses of mapping the customer memory CUST_MEM to the given RRAM. The preference rate PREF(CUST_MEM,RRAM) estimates the gain based on the customer design structure. PRICE(CUST_MEM,RRAM) estimates losses based on the memory basic characteristics (capacity and width). At step 250, the total preference rate can be derived from these two magnitudes as $$TOTAL\_PREF(CUST\_MEM, RRAM) = (1.0 - PRICE(CUST\_MEM, RRAM)) + PREF\_COEF * PREF(CUST\_MEM, RRAM),$$

where PREF_COEF is a preference coefficient that takes various empirical values.

The preference rate is calculated for each customer memory CUST_MEM and platform RRAM pair if the customer memory can be mapped to the RRAM. Otherwise the TOTAL_PREF(CUST_MEM,RRAM) is assigned equal to 0.0.

Consider five variants of the values of the coefficient PREF_COEF (PREF_COEF_VARIANTS_NUM=5):
PREF_COEF_VARIANT[1]=25.0,
PREF_COEF_VARIANT[2]=5.0,
PREF_COEF_VARIANT[3]=1.0,
PREF_COEF_VARIANT[4]=0.2,
PREF_COEF_VARIANT[5]=0.0.

The process of the precise memory mapping deals with the examination of all the variants of coefficient PREF_COEF, finishing with the variant with number PREF_COEF_VARIANTS_NUM. For each variant, the total preference rate TOTAL_PREF(CUST_MEM,RRAM) is calculated as described at step 250 and the memory mapping is attempted as described at step 260 and FIG. 4. If the memory mapping is successfully created, as shown at step 270, then the process of precise memory mapping 200 is completed and the process continues to step 400. If, during a given iteration, the memory mapping creation failed, the process of step 260 proceeds with the next variant of the coefficient PREF_COEF value. If all the variants are examined and memory mappings applied to all of them failed, then the process ends at step 280 because it is not possible to create the memory mapping of customer memories to the given platform.

The procedure of memory mapping creation for the fixed set of magnitudes TOTAL_PREF(CUST_MEM,RRAM) uses two variables: RCELL_MEM_NUM and RRAM_USAGE_RATE. The variable RCELL_MEM NUM is the number of customer memories that are currently mapped to rcells. This variable may take values in the range from 0 to RCELL_LIST_SIZE. The variable RRAM_USAGE RATE is the rate of RRAM's usage. If MEM_NUM(RRAM) is the number of memories in the RRAM, then the number of RRAM memories that are available for customer memory mapping is RRAM_USAGE_RATE*MEM_NUM(RRAM). The variable RRAM_USAGE_RATE takes values from the range 0.9–1.0. As described above it is preferred to use 90% of the memories of the RRAM instead of all the memories to take advantage of the self-repairing feature of the memories. Therefore, the technique will attempt to create the memory mapping with RRAM_USAGE RATE that is close to 0.9 as much as possible.

Figure 4:
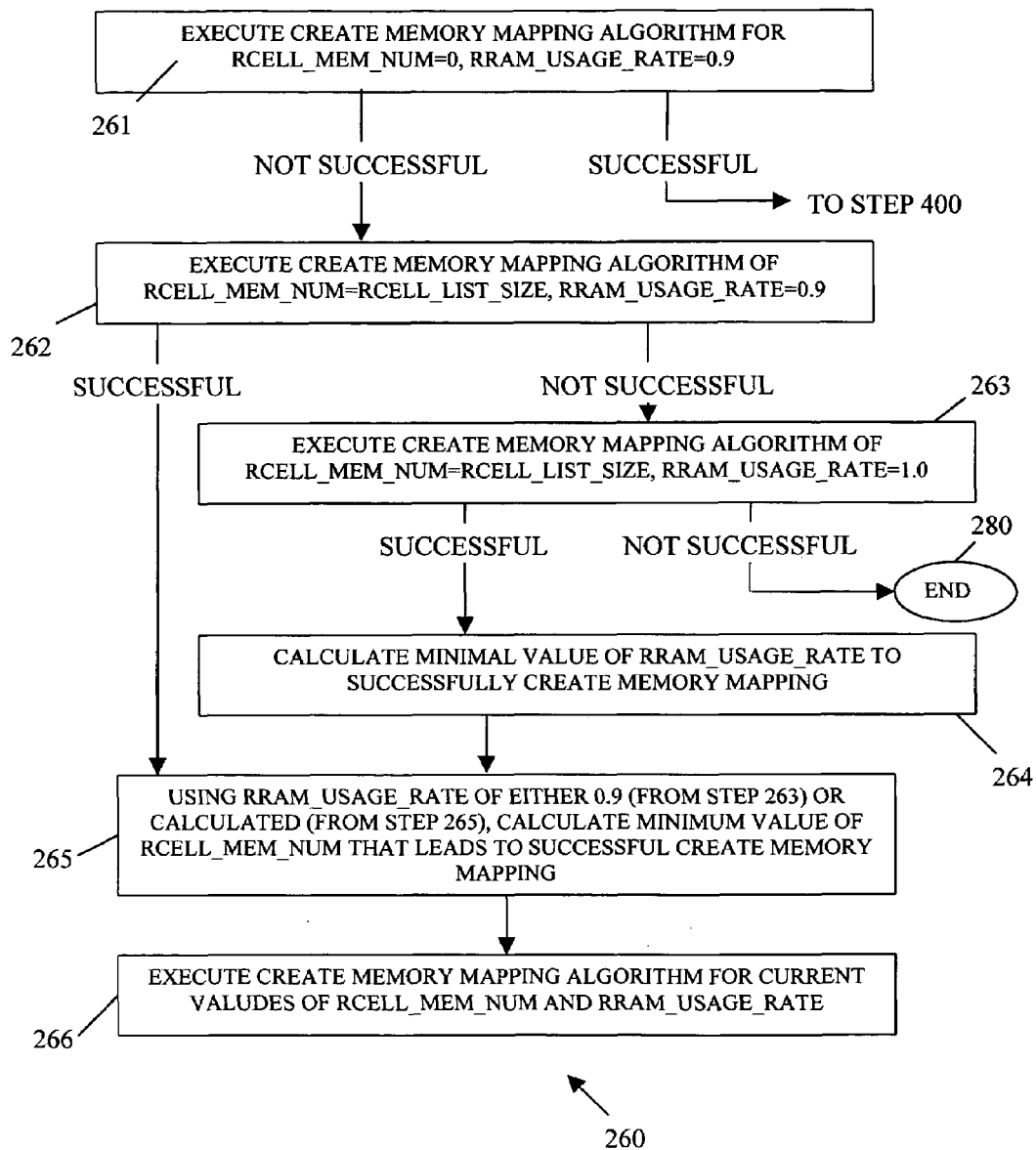

Step 260, shown in greater detail in FIG. 4, uses a process to create memory mapping for a fixed number RCELL_MEM_NUM of rcell memories and fixed usage rate RRAM_ USAGE_RATE, which is described in greater detail below in connection with FIG. 5.

At step 261, memory mapping is created for RCELL_MEM_NUM=0 and RRAM_USAGE_RATE=0.9. If memory mapping is successful, then the process is completed and continues to the internal memory placement stage 400. If the memory mapping is unsuccessful, then at step 262 memory mapping is created for RCELL_MEM_NUM=RCELL_LIST_SIZE, RRAM_USAGE_RATE=0.9. If that memory mapping is successful the process proceeds to step 265; otherwise the process continues to step 263.

Steps 263 and 264 create a memory mapping at a smallest usage rate greater than 90% and less than 100%. At step 263 memory mapping is created for RCELL_MEM_NUM=RCELL_LIST_SIZE, RRAM_USAGE_RATE=1.0. If mapping is successful, then there is a usage rate between 90 and 100% that will successfully result in a mapping, and the process continues to step 264. If at step 263 the mapping attempt is unsuccessful, then the process ends and a report is generated that memory mapping is not possible.

At step 264, the minimal value of RRATE_USAGE RATE for which memory mapping is successfully created for RCELL_MEM_NUM=RCELL_LIST_SIZE. It is preferred that this minimal value be found with a degree accuracy, for example 0.001, by a standard binary cutting algorithm. If min_value=0.9 and max_value=1.0, while (max_value−min_value)>0.001 assign a middle value=(min_value+max_value)/2. If an attempt to create the memory mapping for RCELL_MEM_NUM=RCELL_LIST_SIZE, RRAM_USAGE_RATE=middle_value is successful, assign max_value=middle_value, otherwise assign min_value=middle_value. The process is iteratively repeated until a minimal value of RRAM_USAGE_RATE is found between 0.9 and 1.0 that results in memory mapping.

Step 265 finds the minimal possible value of RCELL_MEM_NUM that still leads to the successful memory mapping for the RRAM_USAGE_RATE identified at step 262 or 264. This is accomplished by a binary cutting algorithm as in step 264. First assign min_value=0, max_value=RCELL_LIST_SIZE. While (max_value−min_ value)>1, assign middle_value=(min_value+max value)/2 and attempt to create the memory mapping for RCELL_MEM_NUM=middle_value, and the current value of the variable RRAM_USAGE_RATE. If successful, assign max_value=middle_value, otherwise assign min_value=middle_value. The process is iteratively repeated until a minimal value of RCELL_MEM_NUM is found with successful memory mapping.

At step 266, the memory mapping procedure is executed for the current values of RCELL_MEM_NUM and RRAM_USAGE_RATE. The success of the process is assured because the values of the variables have been established and tested.

Figure 5:
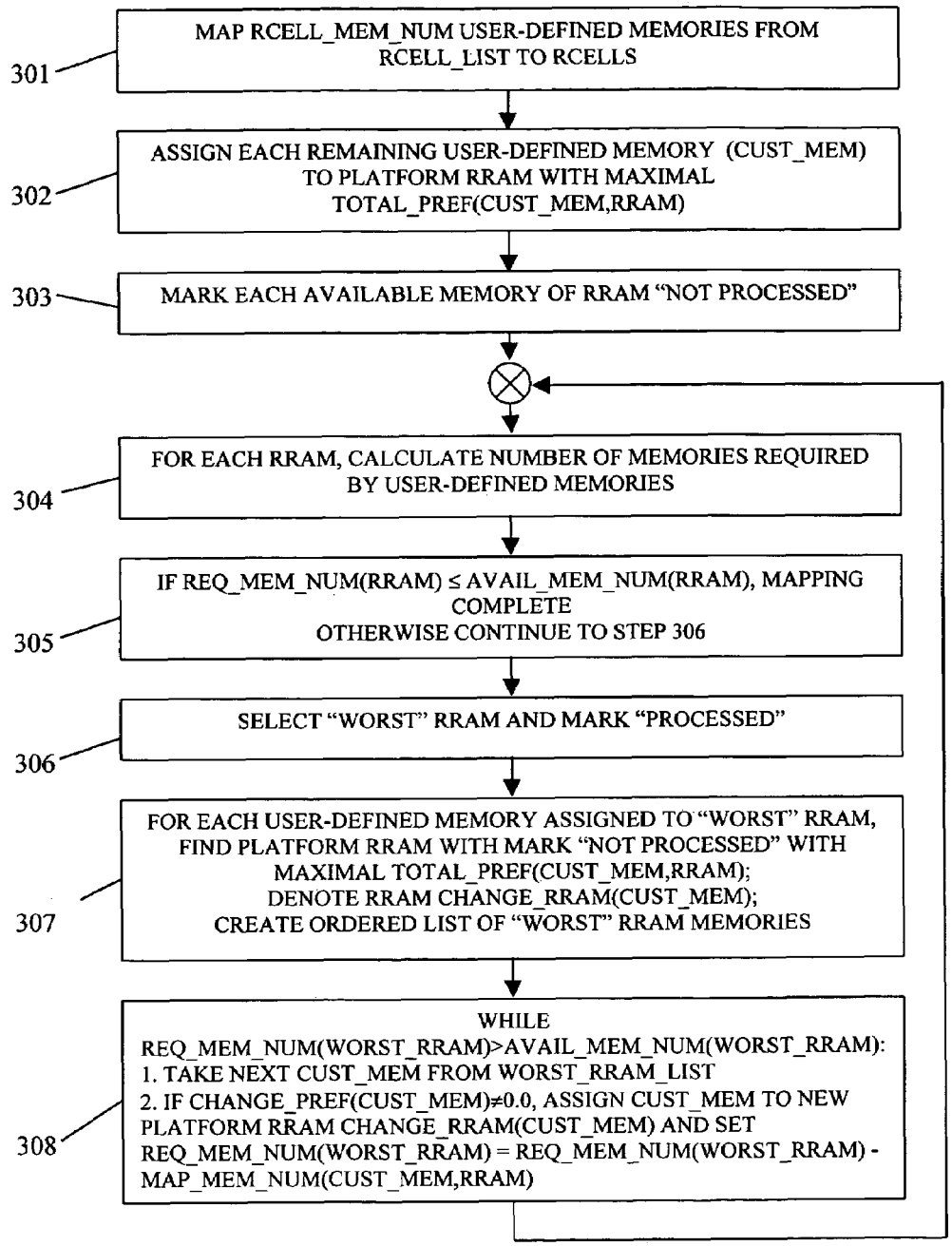

FIG. 5 is a flowchart of the process of memory mapping creation for the fixed set of magnitudes TOTAL_PREF (CUST_MEM,RRAM) and fixed values of variables RCELL_MEM_NUM and RRAM_USAGE_RATE. At step 301, the first RCELL_MEM_NUM customer memories of the list RCELL_LIST are mapped to rcells. These memories are removed from further consideration in the process of FIG. 5. Instead, the remainder of the process attempts to map all the other customer memories to some RRAMs of the platform.

At step 302, each customer memory CUST_MEM is assigned to the platform RRAM for which the value TOTAL_PREF(CUST_MEM_RRAM) is as maximal possible. This is the initial memory mapping that will be subjected to changes in the future. If for some customer memory CUST_MEM for each RRAM the TOTAL_PREF (CUST_MEM,RRAM)=0, the memory mapping failed and the procedure ends.

At step 303 the number of memories available in each RRAM of the platform is calculated as AVAIL_MEM_NUM (RRAM)=RRAM_USAGE_RATE*MEM_NUM(RRAM), and the mark "not processed" is applied to each RRAM of the platform. At step 304 the number REQ_MEM_NUM (RRAM) of memories that are required by the customer memories currently assigned to each RRAM of the platform is calculated.

$$\text{REQ\_MEM\_NUM}(RRAM) = \sum_{CUST\_MEM \text{ is assigned to } RRAM} \text{MAP\_MEM\_NUM}(CUST\_MEM, RRAM).$$

At step 305, if REQ_MEM_NUM(RRAM) ≦AVAIL_MEM_NUM(RRAM) for each RRAM of the platform, then the memory mapping is successful and the current memory assignment to RRAMs and to rcells is output to step 400. Otherwise, at step 306 the "worst" RRAM on the platform is selected. The "worst" RRAM is the RRAM with the mark "not processed" for which the ratio REQ_MEM_NUM(RRAM/AVAIL_MEM_NUM(RRAM) is the maximal possible among all the platform RRAMs with the mark "not processed". This "worst" RRAM is identified as WORST_RRAM and is marked "processed".

At step 307 all customer memories CUST_MEM that are currently assigned to the WORST_RRAM are considered. For each of these memories a platform RRAM with the mark "not processed" is found for which the preferable rate TOTAL_PREF(CUST_MEM.RRAM) is maximal possible. This RRAM is denoted CHANGE_RRAM(CUST_MEM). If no CHANGE_RRAM(CUST_MEM) can be found for some customer memory CUST_MEM (for example if there are no platform RRAMs with the mark "not processed") then the memory mapping failed. If CHANGE_RRAM (CUST_MEM) can be found, denote $$\text{CHANGE\_PREF(CUST\_MEM)} = \frac{\text{TOTAL\_PREF(CUST\_MEM, CHANGE\_RRAM(CUST\_PREF))}}{\text{TOTAL\_PREF(CUST\_MEM, WORST\_RRAM)}}.$$

A list WORST_RRAM_LIST is created of customer memories CUST_MEM assigned to the WORST_RRAM ordered in the descending order of the values CHANGE_PREF (CUST_MEM).

At step 308, while REQ_MEM_NUM(WORST_RRAM)> AVAIL_MEM_NUM(WORST_RRAM) the next customer memory CUST_MEM from the list WORST_RRAM_LIST is considered. If CHANGE_PREF(CUST_MEM)=0.0 then the memory mapping failed. Otherwise, the customer memory CUST_MEM is assigned to the new platform RRAM, CHANGE_RRAM(CUST_MEM), instead of the old one WORST_RRAM. Set REQ_MEM_NUM(WORST_RRAM)=REQ_MEM_NUM(WORST_RRAM)-MAP_MEM_NUM(CUST_MEM,WORST_RRAM) and the process returns to step 304. The process continues until the conditions at step 305 are satisfied and memory mapping is complete.

Internal RRAM Placement Stage 400.

Prior to this stage all the customer memories are already assigned to some RRAM of the platform or mapped to rcells. At this stage the best positions (K) for each customer memory are found inside the RRAM to which this memory is assigned. The position of the customer memory in the RRAM is the list of numbers of RRAM memories used by the given customer memory. If these numbers must be neighbor numbers then it is enough to find the number K(CUST_MEM) of the first RRAM memory that is used by the customer memory CUST_MEM. The numbers of other memories in the RRAM used by the CUST_MEM are then K(CUST_MEM)+1, ..., K(CUST_MEM)+MAP_MEM_NUM(CUST_MEM,RRAM)−1.

Figure 6:
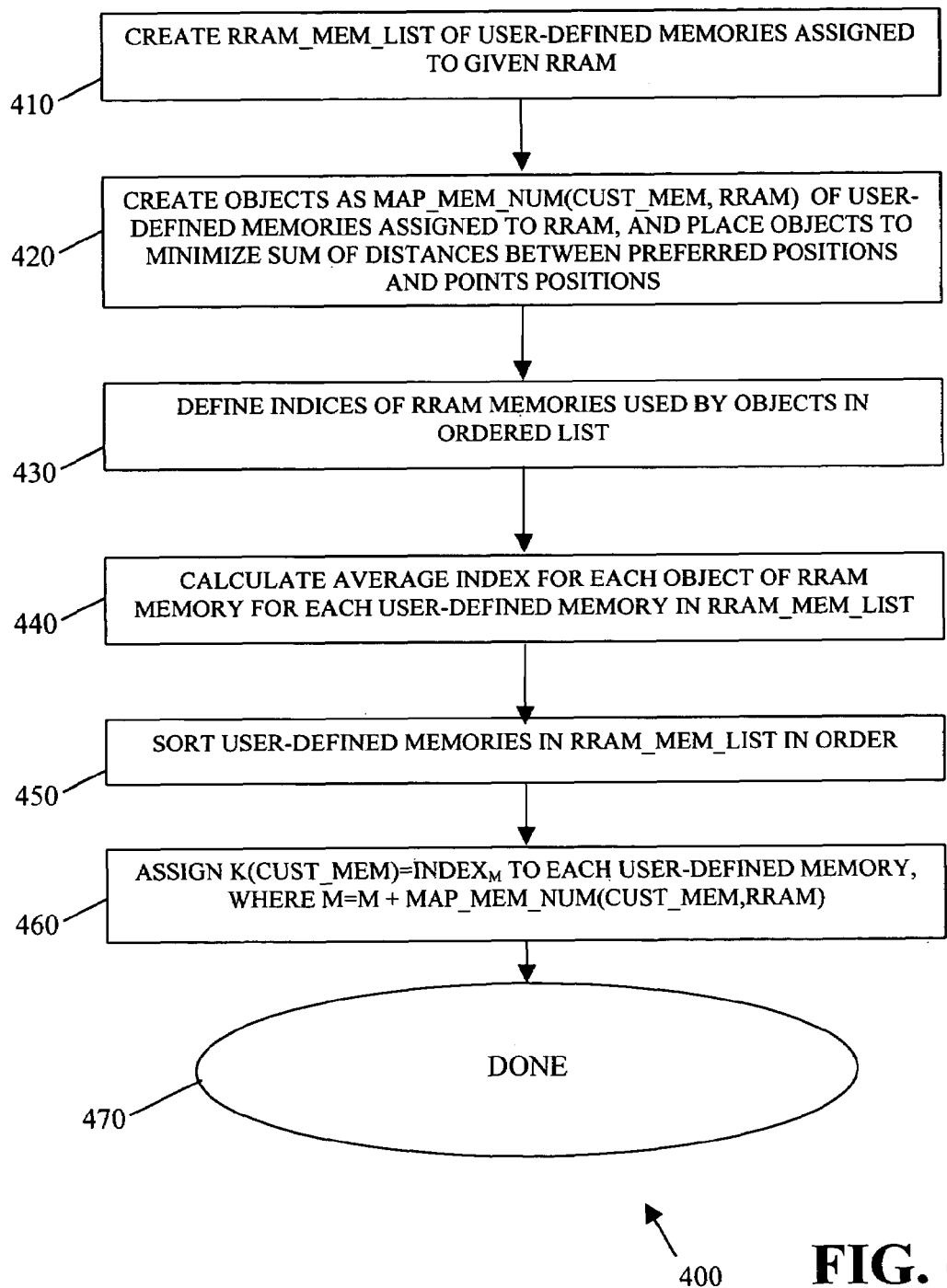

The steps of FIG. 6 are applied to each RRAM. At step 410, a RRAM_MEM_LIST is created of all the customer memories assigned to the given RRAM. The positions of the memories of the RRAM (i.e., the average positions of its pins) are treated as "points with fixed positions". "Objects" are created as MAP_MEM_NUM(CUST_MEM,RRAM) for each customer memory CUST_MEM from list RRAM_MEM_LIST. The positions of these "objects" are the same as the preferable position for placing customer memory CUST_MEM, calculated in step 110. At step 420, the "objects" are assigned to the "points", to minimize the sum of distances between the preferable positions of "objects" and fixed positions of assigned "points". This assignment can be solved using the known Kuhn's algorithm or the fast assignment algorithm described in the aforementioned application Ser. No. 10/688,460. The success of the assignment is assured because the number of "objects" is less than the number of "points".

$INDEX_1, INDEX_2, \ldots, INDEX_N$ are indexes of RRAM memories ("points") used by "objects" in the resulting assignment, where $$N = \sum_{\text{CUST\_MEM} \in \text{RRAM\_MEM\_LIST}} \text{MAP\_MEM\_NUM(CUST\_MEM, } RRAM\text{)}.$$

At step 430, the indexes $INDEX_1 \leq INDEX_2 \leq \ldots \leq INDEX_N$ are sorted in ascending order.

At step 440 the average index AVER_INDEX(CUST_MEM) of RRAM memories ("points") to which the "objects" generated by customer memory CUST_MEM were assigned are calculated for each customer memory CUST_MEM from the list RRAM_MEM_LIST. At step 450, the customer memories in the RRAM_MEM_LIST are sorted in the ascending order of the values AVER_INDEX (CUST_MEM). At step 460, M is assigned an initial value of 0 and each customer memory CUST_MEM in the ordered list RRAM_MEM_LIST is assigned K(CUST_MEM)=INDEX$_M$, where M=M+MAP_MEM_NUM(CUST_MEM, RRAM).

The present invention thus establishes a value of K for each customer memory to enable mapping of the customer memory to the platform RRAM. In preferred embodiments, the process is carried out by a computer employing a computer program comprising computer readable program code recorded or embedded on a computer-readable medium, such as a recording disk or other readable device.

Although the present invention has been described with reference to preferred embodiments, workers skilled in the art will recognize that changes may be made in form and detail without departing from the spirit and scope of the invention.

What is claimed is:

1. A process for mapping a user-defined memory design comprising a plurality of customer memories to memories of a base platform for an IC that contains a plurality of memory sets, each containing a plurality of memories, the process comprising steps of:
   a) selecting an optimal memory set from the plurality of memory sets for the design, and
   b) optimally mapping the design to a plurality of memories of the selected memory set, including:
      b1) initially placing at least some of the customer memories to positions in the memory set relative to respective preferred positions in the selected memory set;
      b2) defining indices of the positions in the selected memory set to which the customer memories are initially placed;
      b3) ordering the customer memories placed in the selected memory set according to the respective indices; and
      b4) assigning successive numbers of the memories of the selected memory set to each of the customer memories in the order of step b3).

2. The process of claim 1, wherein step a) comprises steps of:
   selecting a preference rate for each memory set, which rates a preference for mapping the design to that memory set, based on the design and its connections to portions of the IC, and
   selectively assigning the design to one of the memory sets based on the preference rate.

3. The process of claim 2, wherein the assignment of the design comprises steps of:
   calculating a price for mapping each customer memory to each memory set,
   calculating total preference rates for each memory set based on the price and the preference rate for that memory set,
   mapping customer memories to memory sets based on respective total preference rates, and selecting the memory set to which at least some of the customer memories are mapped based on the total preference rate.

4. The process of claim 3, wherein the mapping customer memories to memory sets comprises steps of:
   i) mapping all customer memories to the selected memory set at a selected usage rate,
   ii) if the mapping of step i) is not successful, mapping a group of less than all customer memories to the selected memory set at the selected usage rate,
   iii) if the mapping of step ii) is not successful, identifying an altered usage rate to successfully map the group of customer memories to the selected memory set at the altered usage rate, and
   iv) mapping all or the group of customer memories to the selected memory set at the selected or altered usage rate to successfully map the all or group of customer memories to the selected memory set.

5. The process of claim 4, wherein step iv) comprises:
   mapping the customer memories that are not part of the group of customer memories to cells outside the selected memory set,
   calculating the number of memories of each memory set required for the group of customer memories,
   if the memory set to which the group is assigned contains a number of memories sufficient for the group, mapping the group to that memory set,
   if the memory set to which the group is assigned contains a number of memories insufficient for the group, assigning the group to another memory set.

6. The process of claim 3, further comprising steps of:
   defining a group of less than all customer memories that can be mapped to cells outside the respective memory set.

7. The process of claim 6, wherein the mapping customer memories to memory sets comprises steps of:
   i) mapping all customer memories to the selected memory set at a selected usage rate,
   ii) if the mapping of step i) is not successful, mapping the group of customer memories to the selected memory set at the selected usage rate,
   iii) if the mapping of step ii) is not successful, identifying an altered usage rate to successfully map the group of customer memories to the selected memory set at the altered usage rate, and
   iv) mapping all or the group of customer memories to the selected memory set at the selected or altered usage rate to successfully map the all or group of customer memories to the selected memory set.

8. The process of claim 7, wherein step iv) comprises:
   mapping the customer memories that are not part of the group of customer memories to the cells outside the selected memory set,
   calculating the number of memories of each memory set required for the group of customer memories,
   if the memory set to which the group is assigned contains a number of memories sufficient for the group, mapping the group to that memory set,
   if the memory set to which the group is assigned contains a number of memories insufficient for the group, assigning the group to another memory set.

9. A computer useable medium having a computer readable program embodied therein for addressing data to map a user-defined memory design comprising a plurality of customer memories to memories of a base platform for an IC that contains a plurality of memory sets, each set containing a plurality of memories, the computer readable program comprising:
   first computer readable program code for causing a computer to select an optimal memory set from the plurality of memory sets for the design, and
   second computer readable program code for causing the computer to optimally map the design to a plurality of memories of the selected memory set, including:
      b1) initially placing at least some of the customer memories to positions in the memory set relative to respective preferred positions in the selected memory set;
      b2) defining indices of the memories in the selected memory set to which the customer memories are initially placed;
      b3) ordering the customer memories placed in the selected memory set according to the respective indices; and
      b4) assigning successive numbers of the memories of the selected memory set to each of the customer memories in the order of step b3).

10. The computer useable medium of claim 9, wherein the first computer readable program code comprises:
    computer readable program code for causing the computer to select a preference rate for each memory set from the plurality of sets, which rates a preference for mapping the design to that memory set, based on the design and its connections to portions of the IC, and
    computer readable program code for causing the computer to selectively assign the design to one of the memory sets based on the preference rate.

11. The computer useable medium of claim 10, wherein the computer readable program code that causes the computer to assign the design further comprises:
    computer readable program code for causing the computer to calculate a price for mapping each customer memory to each memory set,
    computer readable program code for causing the computer to calculate total preference rates for each memory set based on the price and the preference rate for that memory set,
    computer readable program code for causing the computer to map customer memories to memory sets based on respective total preference rates, and
    computer readable program code for causing the computer to select the memory set to which at least some of the customer memories are mapped based on the total preference rate.

12. The computer useable medium of claim 11, wherein the computer readable program code that causes the computer to map customer memories to memory sets further comprises:
    computer readable program code for causing the computer to
    map all customer memories to the selected memory set at a selected usage rate, and
    if the mapping of all customer memories is not successful, map a group of less than all customer memories to the selected memory set at the selected usage rate, and
    if the mapping of the group is not successful, identify an altered usage rate to successfully map the group of customer memories to the selected memory set at the altered usage rate, and
    map all or the group of customer memories to the selected memory set at the selected or altered usage rate to successfully map the all or group of customer memories to the selected memory set.

13. The computer useable medium of claim 12, wherein the computer readable program code that causes the computer to map customer memories to the memory set further comprises:
   computer readable program code for causing the computer to map the customer memories that are not part of the group of customer memories to cells outside the selected memory set,
   computer readable program code for causing the computer to calculate the number of memories of each memory set required for the group of customer memories,
   computer readable program code responsive to a sufficient number of memories in the memory set for the group to cause the computer to map the group to that memory set,
   computer readable program code responsive to an insufficient number of memories for the group for causing the computer to assign the group to another memory set.

14. The computer useable medium of claim 11, wherein the computer readable program further comprising:
   computer readable program code for causing the computer to define a group of less than all customer memories that can be mapped to cells outside the respective memory set.

15. The computer useable medium of claim 14, wherein the computer readable program code that causes the computer to map customer memories to memory sets further comprises:
   computer readable program code for causing the computer to
   map all customer memories to the selected memory set at a selected usage rate, and
   if the mapping of all customer memories is not successful, map a group of less than all customer memories to the selected memory set at the selected usage rate, and
   if the mapping of the group is not successful, identify an altered usage rate to successfully map the group of customer memories to the selected memory set at the altered usage rate, and
   map all or the group of customer memories to the selected memory set at the selected or altered usage rate to successfully map the all or group of customer memories to the selected memory set.

16. The computer useable medium of claim 15, wherein the computer readable program code that causes the computer to map customer memories to the memory set further comprises:
   computer readable program code for causing the computer to map the customer memories that are not part of the group of customer memories to cells outside the selected memory set,
   computer readable program code for causing the computer to calculate the number of memories of each memory set required for the group of customer memories,
   computer readable program code responsive to a sufficient number of memories in the memory set for the group to cause the computer to map the group to that memory set,
   computer readable program code responsive to an insufficient number of memories for the group for causing the computer to assign the group to another memory set.

* * * * *